(12) United States Patent
Maglica

(10) Patent No.: US 10,012,376 B2
(45) Date of Patent: *Jul. 3, 2018

(54) LED FLASHLIGHT WITH IMPROVED HEAT SINK

(71) Applicant: Mag Instrument, Inc., Ontario, CA (US)

(72) Inventor: Anthony Maglica, Ontario, CA (US)

(73) Assignee: MAG INSTRUMENT, INC., Ontario, CA (US)

( * ) Notice: Subject to any disclaimer, the term of this patent is extended or adjusted under 35 U.S.C. 154(b) by 111 days.

This patent is subject to a terminal disclaimer.

(21) Appl. No.: 15/585,321

(22) Filed: May 3, 2017

(65) Prior Publication Data

US 2017/0248299 A1    Aug. 31, 2017

Related U.S. Application Data

(63) Continuation of application No. 15/285,426, filed on Oct. 4, 2016, now Pat. No. 9,671,102, which is a continuation of application No. 15/182,396, filed on Jun. 14, 2016, now Pat. No. 9,494,308, which is a continuation-in-part of application No. 15/148,505, filed on May 6, 2016, now Pat. No. 9,453,625, which (Continued)

(51) Int. Cl.
| | | |
|---|---|---|
| *F21L 4/00* | (2006.01) |
| *F21V 7/00* | (2006.01) |
| *F21V 29/70* | (2015.01) |
| *F21V 23/04* | (2006.01) |
| *F21V 3/00* | (2015.01) |
| *F21V 17/10* | (2006.01) |
| *F21V 23/06* | (2006.01) |
| *F21V 19/00* | (2006.01) |
| *F21Y 115/10* | (2016.01) |

(52) U.S. Cl.
CPC .............. *F21V 29/70* (2015.01); *F21L 4/005* (2013.01); *F21V 3/00* (2013.01); *F21V 17/101* (2013.01); *F21V 19/005* (2013.01); *F21V 23/0428* (2013.01); *F21V 23/06* (2013.01); *F21Y 2115/10* (2016.08)

(58) Field of Classification Search
CPC . F21V 17/12; F21V 15/04; F21V 7/00; F21V 29/70

See application file for complete search history.

(56) References Cited

U.S. PATENT DOCUMENTS 4,286,311 A * 8/1981 Maglica ................... F21L 4/005
                                                     200/242
8,733,966 B2 * 5/2014 Maglica ................... F21L 4/027
                                                     362/202
9,494,308 B1 * 11/2016 Maglica ................... F21V 29/70

(Continued)

*Primary Examiner* — Anabel Ton
(74) *Attorney, Agent, or Firm* — Roy L Anderson

(57) ABSTRACT

One electrical lead from an LED package is soldered to an inner electrically conductive member positioned and electrically isolated from an outer electrically conductive member by electrically insulating material while a second electrical lead and a neutral lead from the LED are soldered to the outer electrically conductive member so that heat is transferred from an LED die within the LED package to the outer electrically conductive member and then to a thermally conductive outer casing with a thermal path that minimizes thermal resistance.

8 Claims, 24 Drawing Sheets

Related U.S. Application Data is a continuation-in-part of application No. 14/971,971, filed on Dec. 16, 2015.

(60) Provisional application No. 62/095,733, filed on Dec. 22, 2014.

(56) References Cited

U.S. PATENT DOCUMENTS

| | | | |
|---|---|---|---|
| 9,671,102 B2 * | 6/2017 | Maglica | F21V 29/70 |
| 2004/0079957 A1 * | 4/2004 | Andrews | H01L 33/486 257/100 |
| 2005/0017366 A1 * | 1/2005 | Galli | F21V 29/004 257/758 |
| 2007/0109775 A1 * | 5/2007 | Chen | F21L 4/027 362/187 |
| 2007/0117273 A1 * | 5/2007 | Elpedes | H01L 33/642 438/123 |
| 2010/0219775 A1 * | 9/2010 | Maglica | F21L 4/045 315/362 |
| 2010/0314655 A1 * | 12/2010 | Thompson | F21K 9/00 257/99 |
| 2011/0111536 A1 * | 5/2011 | Brunner | F21K 9/00 438/26 |
| 2014/0218902 A1 * | 8/2014 | Maglica | F21V 14/045 362/188 |
| 2014/0347646 A1 * | 11/2014 | Dmitriev | G02B 27/0043 355/67 |

* cited by examiner

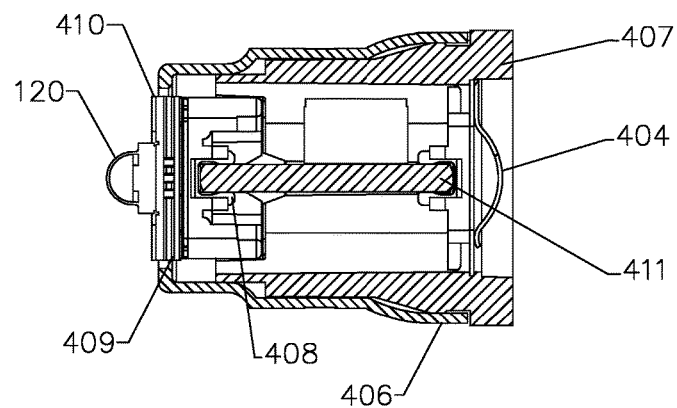
FIG. 2D
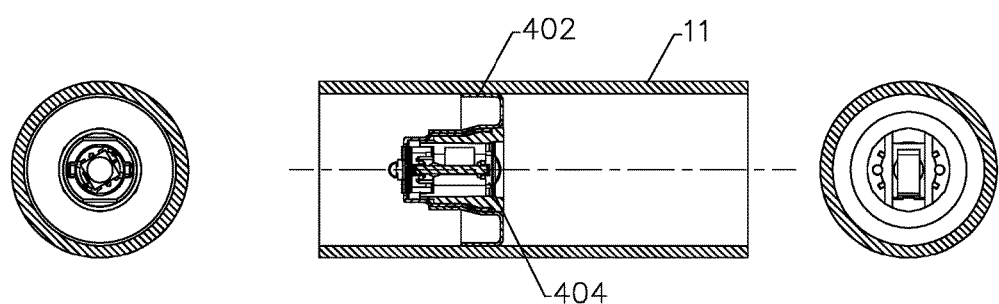
FIG. 2A
FIG. 2B
(PRIOR ART)
FIG. 2C

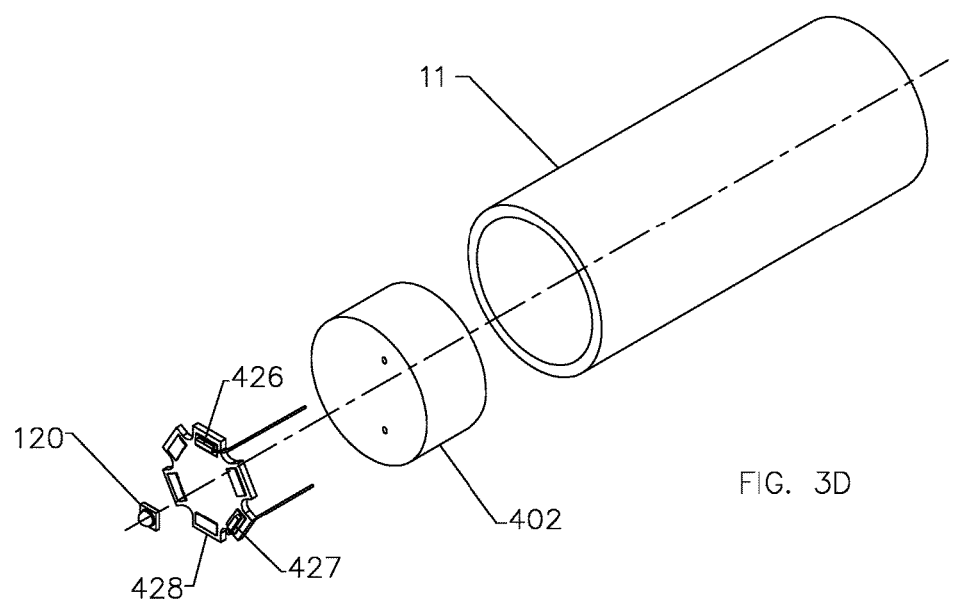
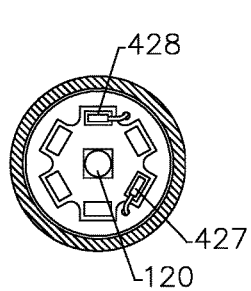
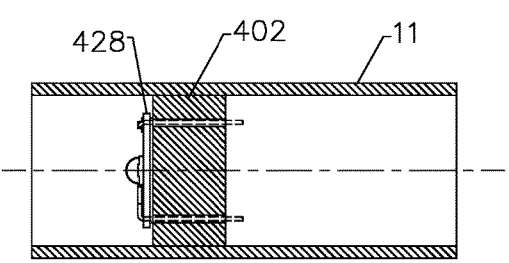
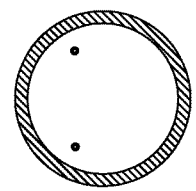
FIG. 3A
FIG. 3B
(PRIOR ART)
FIG. 3C

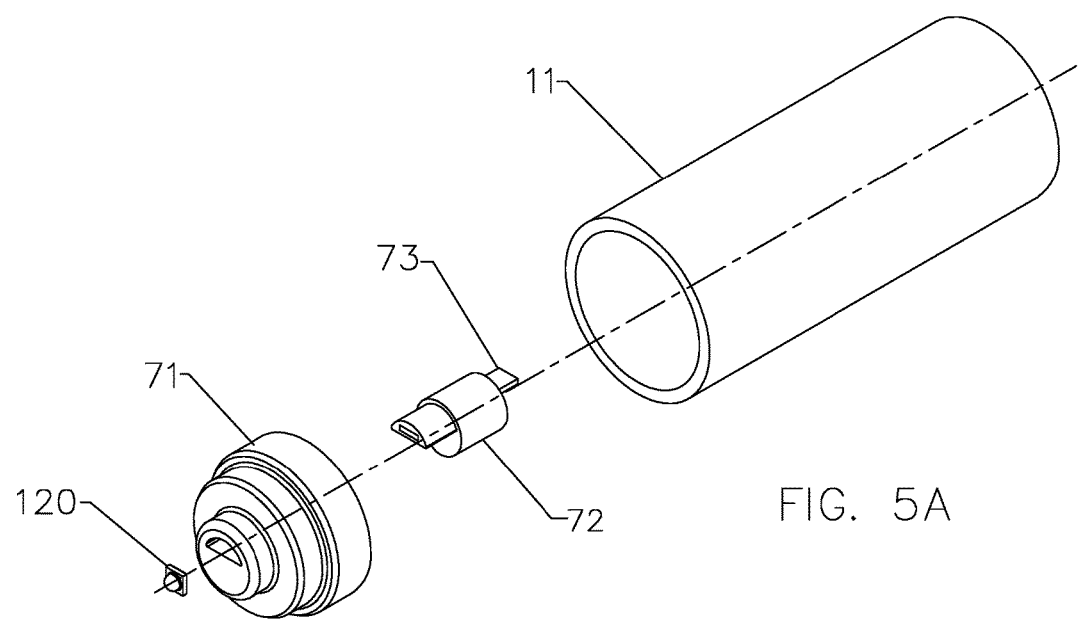

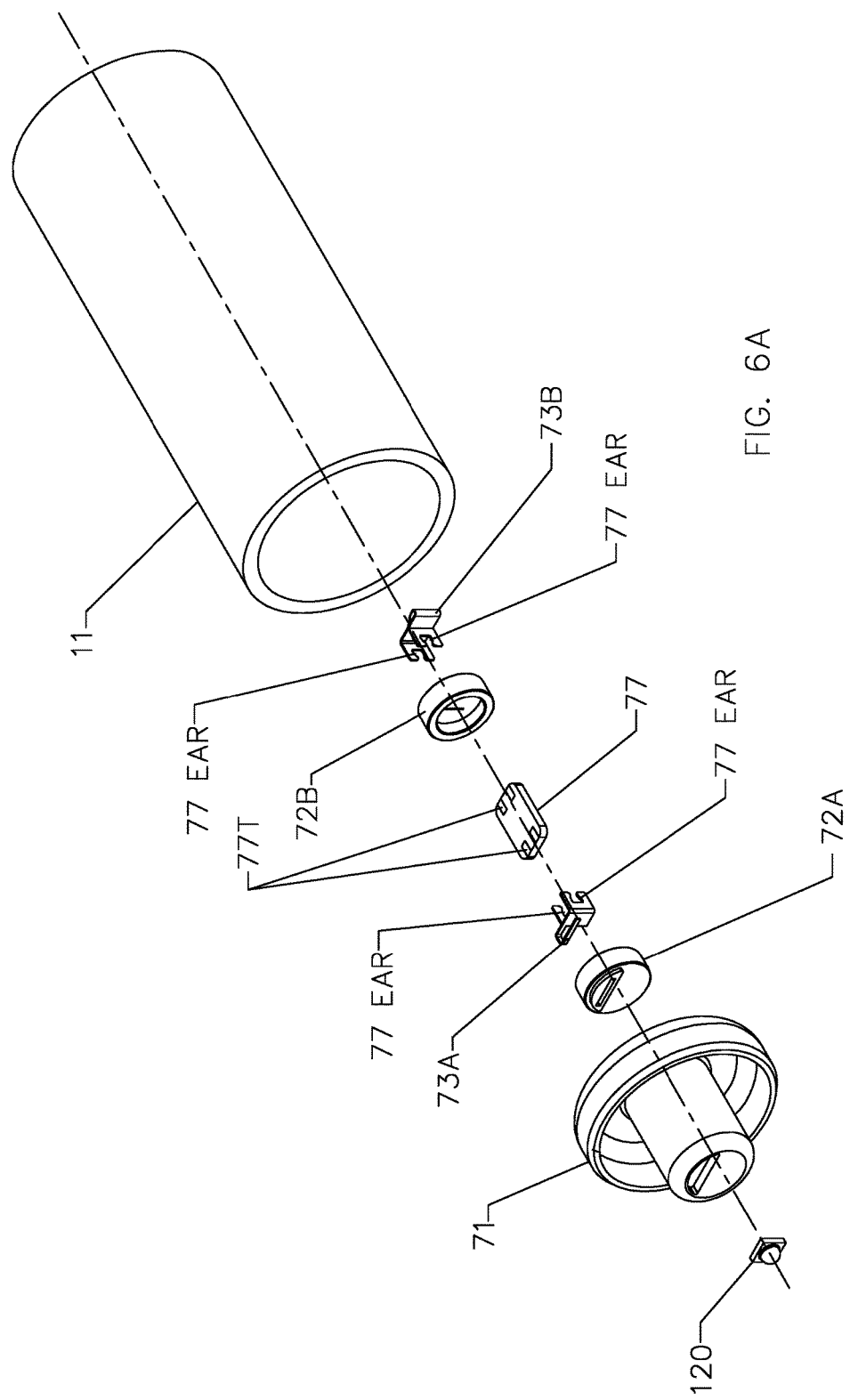

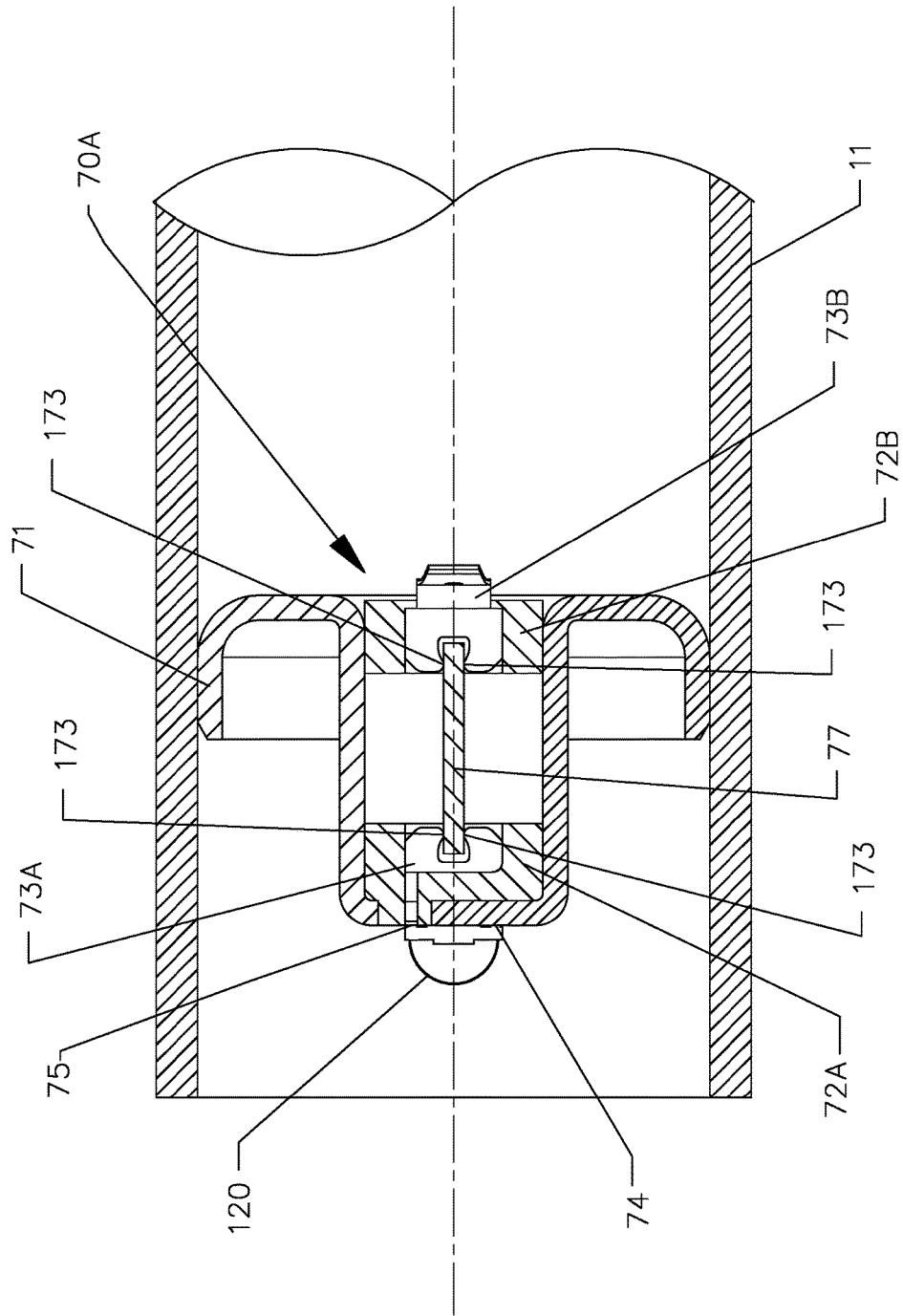

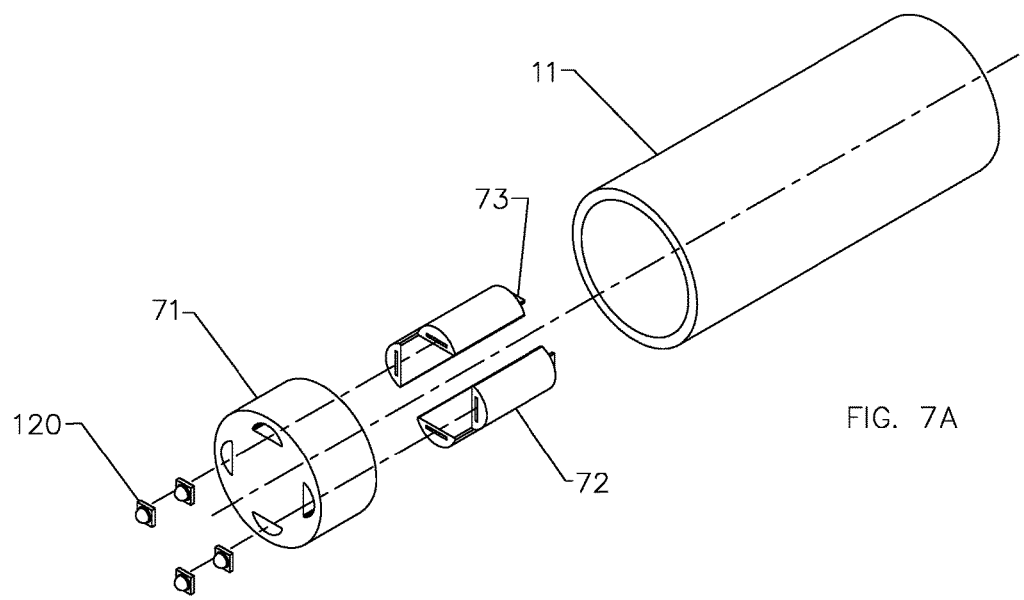
FIG. 7A
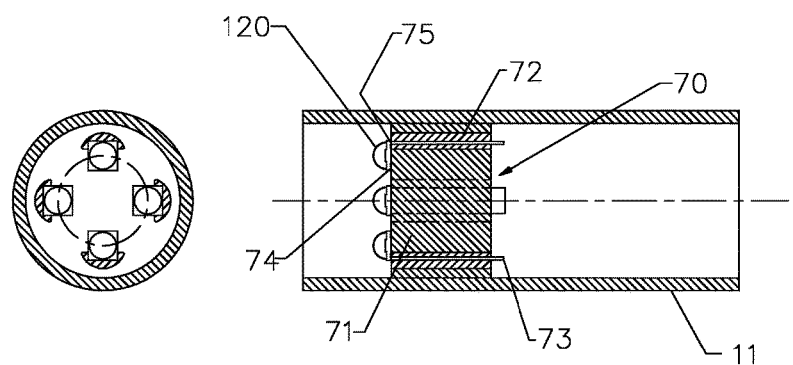
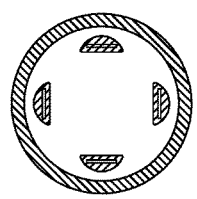
FIG. 7C  FIG. 7B  FIG. 7D

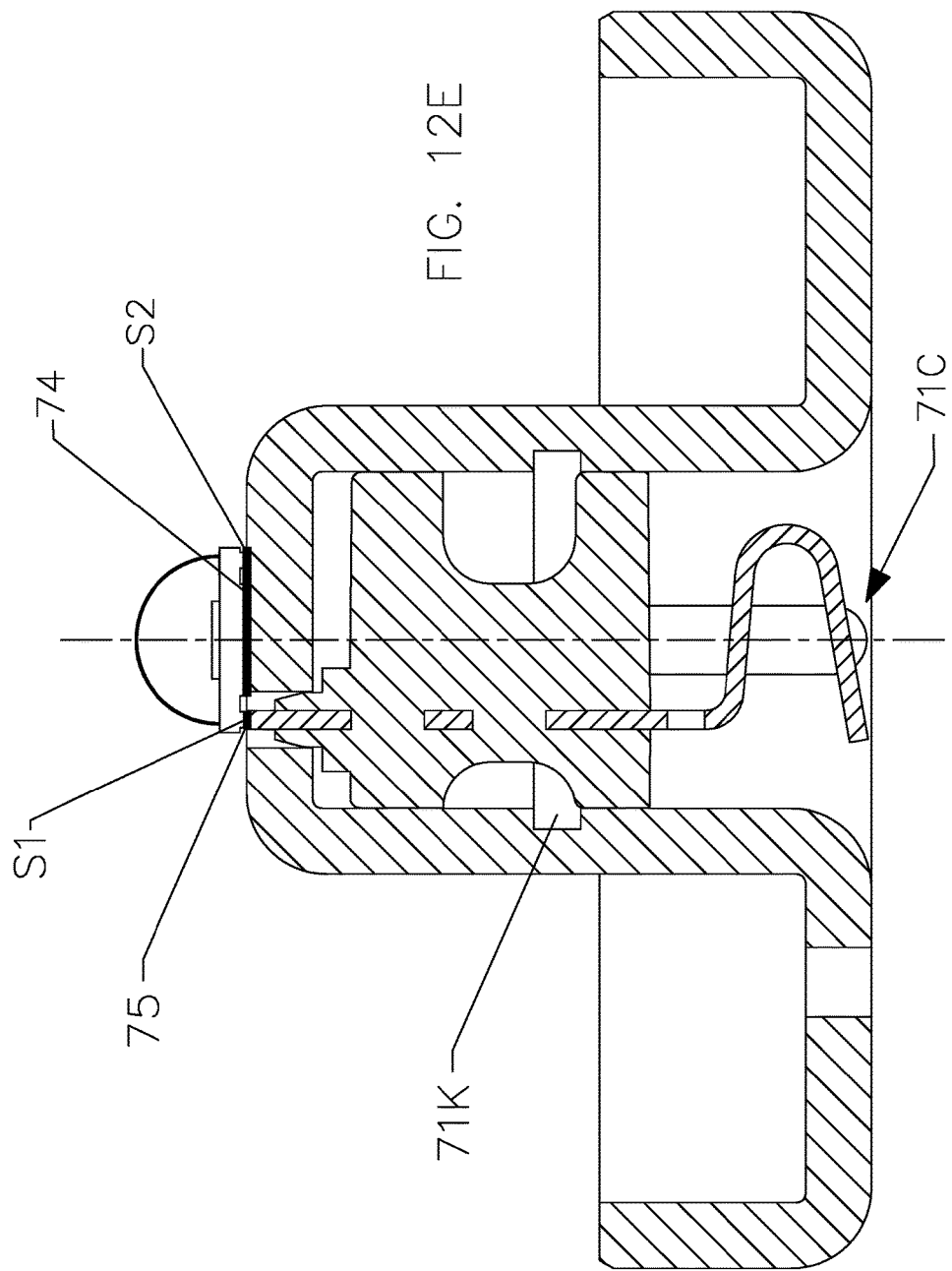

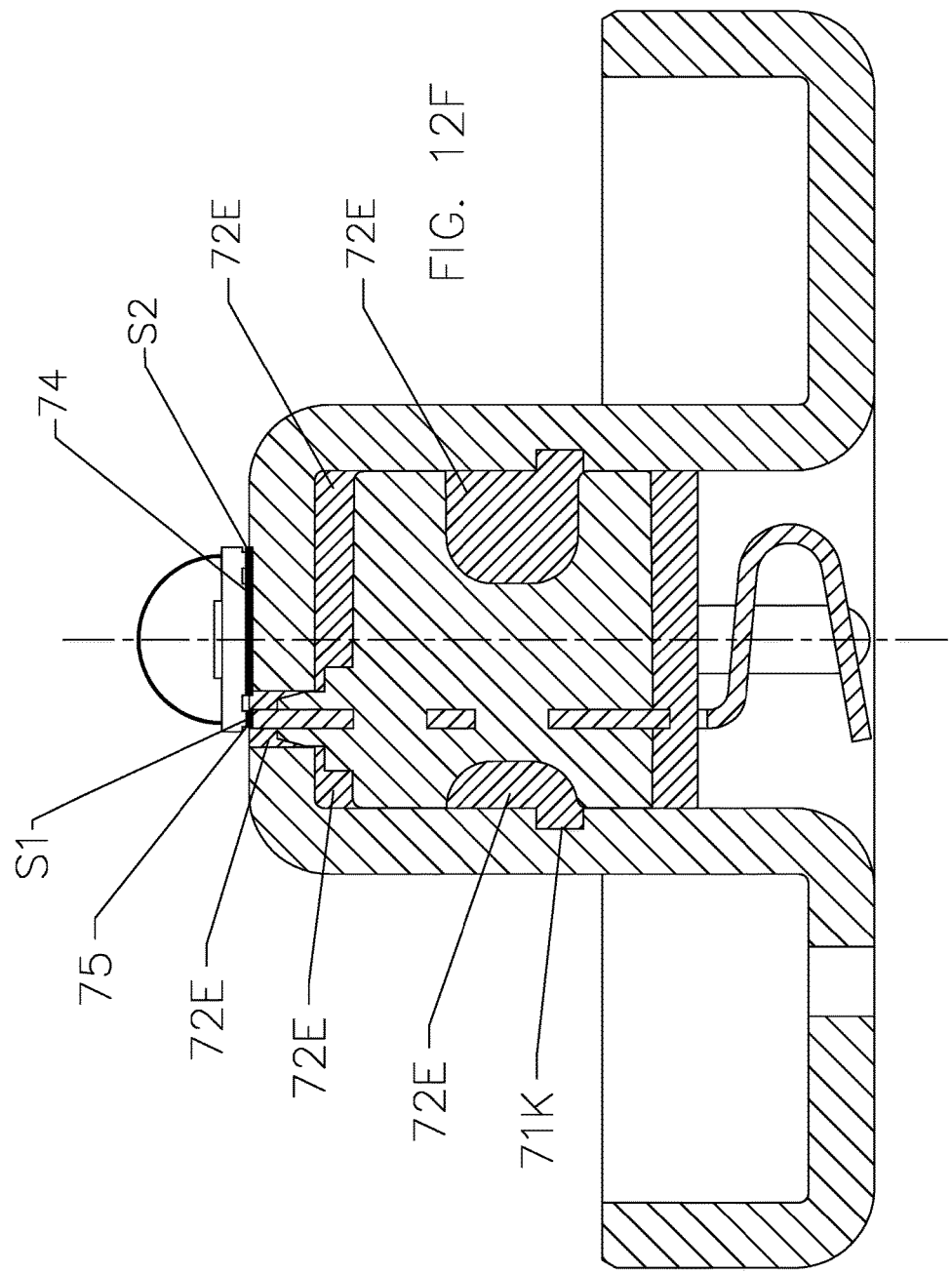

LED FLASHLIGHT WITH IMPROVED HEAT SINK

CROSS REFERENCE TO RELATED APPLICATIONS

This application is a continuation of U.S. Ser. No. 15/285,426, filed Feb. 3, 2017 which is a continuation of U.S. Ser. No. 15/182,396, filed Jun. 4, 2016, now U.S. Pat. No. 9,494,308, issued Nov. 15, 2016 which is a continuation-in-part application of U.S. Ser. No. 15/148,505, filed May 6, 2016, now U.S. Pat. No. 9,453,625, issued Sep. 27, 2016, which is a continuation-in-part application of U.S. Ser. No. 14/971,971, filed Dec. 16, 2015, which is a non-provisional application which claims priority from U.S. Ser. No. 62/095,733, filed Dec. 22, 2014, the disclosures of all of which are specifically incorporated by reference herein in their entireties.

FIELD OF THE INVENTION

This application is in the field of flashlights that use surface mount light emitting diodes (LEDs) as light sources.

BACKGROUND OF THE INVENTION

It is well known that LEDs give off heat during operation and that light output from an LED decreases with increasing LED die junction temperature. Accordingly, there is a well-recognized need for reducing LED die junction temperatures in LED flashlights to increase performance.

The present invention discloses and teaches a much improved LED lighting device, preferably with an outer metallic flashlight housing or barrel, which achieves superior performance through improved heat control of LED die junction temperature via an improved heatsink assembly.

SUMMARY OF THE INVENTION

The present invention is generally directed to a lighting device, such as a flashlight, having heatsink technology in which one electrically conductive pad of an LED package is thermally and electrically bonded to an inner electrically conductive member which is positioned and electrically isolated from an outer electrically conductive member by electrically insulating material and a second electrically conductive pad and the thermal pad of the LED package are thermally and electrically bonded (such as by use of solder) to the outer electrically conductive member so that heat is transferred from an LED die within the LED package to the outer electrically conductive member and then to a thermally conductive outer casing with a thermal path in which thermal resistance is minimized.

Accordingly, it is a primary object of the present invention to provide improved heatsink technology.

This and further objects and advantages will be apparent to those skilled in the art in connection with the drawings and the detailed description of the invention set forth below.

BRIEF DESCRIPTION OF THE DRAWINGS

FIGS. 2A-E illustrate a prior art LED assembly showing the LED soldered to a PC board. FIG. 2B is a cross sectional view which is shown exploded in FIG. 2E while FIGS. 2A and 2C are, respectively, top and bottom views looking into the apparatus shown in cross section in FIG. 2B, and FIG. 2D is an enlarged cutaway view of FIG. 2B.

FIGS. 3A-D illustrate a widely used prior art star type, metal and ceramic backed PC board to which the LED is mounted for use in a flashlight. FIG. 3B is a cross sectional view which is shown exploded in FIG. 3D while FIGS. 3A and 3C are, respectively, top and bottom views looking into the apparatus shown in cross section in FIG. 3B.

FIG. 4B is a cross sectional view which is shown exploded in FIG. 4A while FIGS. 4C and 4D are, respectively, top and bottom views looking into the apparatus shown in cross section in FIG. 4B.

FIGS. 5A-D illustrate a variation on the heatsink assembly shown in FIGS. 4A-D.

FIGS. 6A-D illustrate a variation on the heatsink assembly shown in FIGS. 4A-D in which a printed circuit board (PCB) is held within the heatsink assembly.

FIGS. 7A-D illustrate a circular array of LEDs mounted on a common heatsink assembly. Four LEDS are shown, but there could be any number of LEDs. FIG. 7B is a cross sectional view which is shown exploded in FIG. 7A while FIGS. 7C and 7D are, respectively, top and bottom views looking into the apparatus shown in cross section in FIG. 7B.

FIGS. 8 and 9 are block diagrams of a heatsink mounted LED with positive and negative polarity heatsinks, respectfully, while

FIGS. 12A-G illustrate manufacture of a heatsink assembly in accordance with one embodiment of the present invention. FIG. 12C is a cross sectional view of the heatsink assembly, which is shown enlarged in FIG. 12E. FIG. 12A illustrates insertion of a molded piece, containing parts 72 and 73 (which are shown enlarged in FIG. 12G), into a cavity of heat sink 71, after which an LED package is soldered to the assembly by applying solder to solder points S1P and S2P illustrated in FIG. 12B, while FIG. 12F illustrates the heat sink assembly after an epoxy has been used to firmly secure the parts held within the cavity. It should be noted that the thickness of S1 and S2 shown in FIGS. 12C and 12 has been exaggerated so that they are visibly discernable. FIG. 12D is an enlarged view of FIG. 12B.

FIGS. 13A-B illustrate a process for manufacturing a heatsink assembly in accordance with the present invention in which solder is used to solder pads of an LED assembly to a top surface of an outer electrically conductive member to form a heatsink assembly while

FIG. 15 is an exploded view which illustrates an LED flashlight with an improved heatsink in accordance with the present invention while

DETAILED DESCRIPTION OF THE INVENTION

Figures 1, 1A:
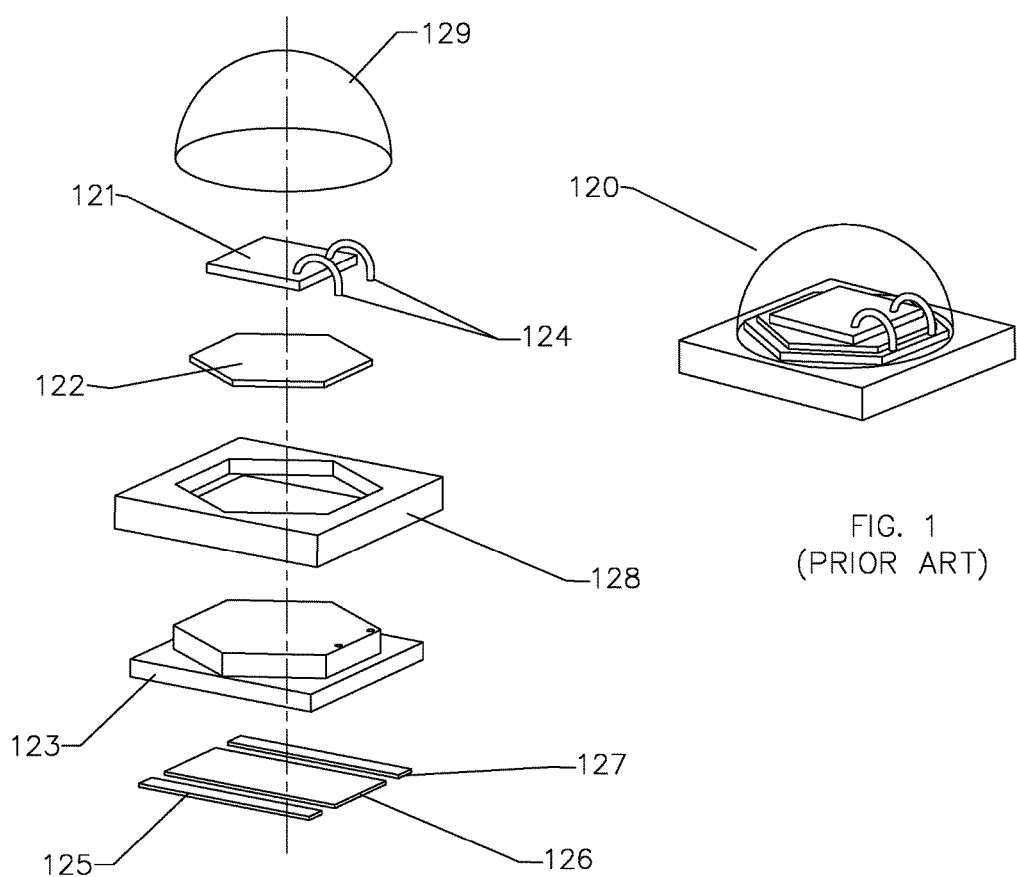
FIG. 1 illustrates a surface mount LED package, such as a Cree® XLamp® XP-G2 LED, which constitutes prior art.
FIG. 1A is an exploded assembly view of FIG. 1.
Figure 2E:
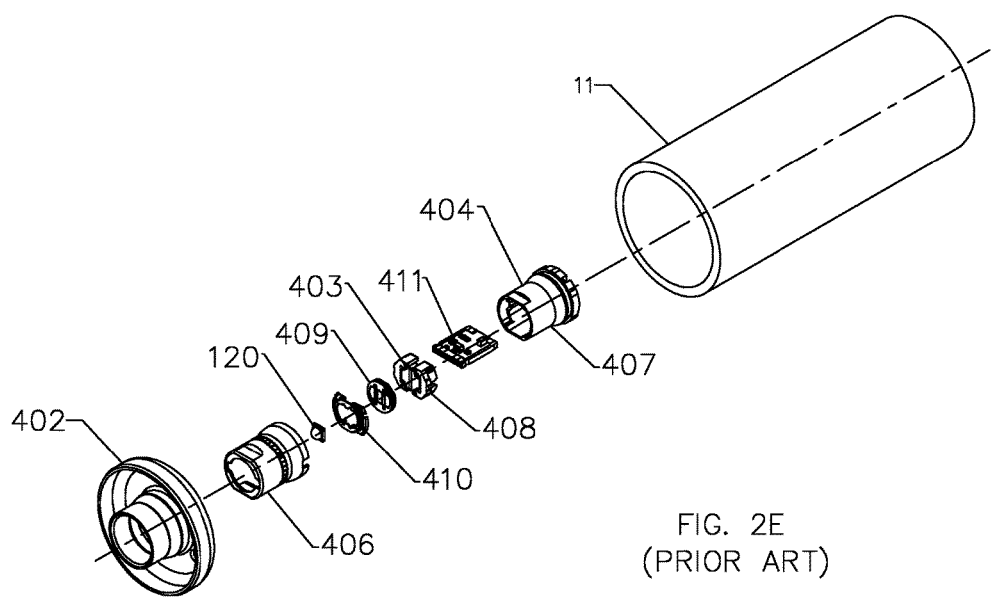

In the Figures and the following detailed description, numerals indicate various physical components, elements or assemblies, with like numerals referring to like features throughout both the drawings and the description. Although the Figures are described in greater detail below, the following is a glossary of elements identified in the Figures.
1 flashlight
11 barrel of flashlight 1
11A shoulder of barrel 11
11AT top surface of shoulder 11A
11B nut
42 lip seal
51 tail cap
51 outer member of tail cap
58 spring
70 heatsink assembly
70A heatsink assembly with PCB held in core material
71 outer electrically conductive member of heatsink assembly 70
71C cavity formed in outer electrically conductive member 71
71K keyway in outer electrically conductive member 71
71OP opening in top surface 71T
71T top surface of outer electrically conductive member 71
72 core of an electrically insulating material of heatsink assembly 70
72A upper portion of core of an electrically insulating material of heatsink assembly 70A
72B lower portion of core of an electrically insulating material of heatsink assembly 70A
72E epoxy
72P passageway formed in core 72 into which epoxy 72E is flowed
73 inner electrically conductive member of heatsink assembly 70
73A upper portion of inner electrically conductive member of heatsink assembly 70A
73B lower portion of inner electrically conductive member of heatsink assembly 70A
73T top surface of inner electrically conductive member 73
74 thermal junction and electrical connection between LED package 120 and outer electrically conductive member 71
75 electrical connection between LED package 120 and inner electrically conductive member 73
76 thermal junction between outer electrically conductive member 71 and barrel 11
77 printed circuit board
77EAR ear for engaging PCB 77
77T trace on PCB 77
100 battery
120 LED package
121 LED die of LED package 120
122 silicon sub-mount of LED package 120
123 heat conductive material of LED package 120
124 wire bond of LED package 120
125 contact pad of LED package 120
126 contact pad of LED package 120
127 contact pad of LED package 120
128 outer casing of LED package 120
129 clear dome of LED package 120
173 electrical contact between 77EAR and 77T
402 heatsink
403 insulator
404 contact for supplying power to PCB
406 housing
407 insulator
408 contact for connecting PCB 111 to PCB 109
409 multilayered PCB
410 ring contact
411 PCB
426 first power connection
427 second power connection
428 star PCB
500 face cap
501 O-ring
502 lens
503 reflector
504 threaded nut
505 retaining ring
506 O-ring
508 O-ring
509 internal snap ring
510 actuator
511 switch port seal
512 switch
S1 solder
S1P solder point for solder S1
S2 solder
S2P solder point for solder S2

The present invention is generally applicable to many different types of lighting devices, an especially preferred embodiment of which is flashlights having an outer metallic casing, examples of which are described in U.S. Pat. Nos. 6,361,183 and 8,366,290, the disclosures of which are specifically incorporated by reference herein. Hereinafter, the invention will be illustrated by use of a flashlight without limiting the invention solely to such an embodiment.

Metallic flashlights have been using one or more light emitting diodes ("LEDs") as a light source for a number of years. LEDs can be purchased from a number of suppliers, one example of which is Cree, and for purposes of illustration, Cree® XLamp® XP-G2 LEDs can be used as suitable LEDs.

An LED useful in the present invention is illustrated in FIGS. 1 and 1A, in which an LED package 120 has an LED die 121 located on top of a silicon sub-mount 122 which is located atop a heat conductive material 123 while the bottom of LED package 120 has three surface mount contact pads 125, 126 and 127, heat conductive material 123 being held within an outer casing 128, there being a clear dome 129 placed around and above die 121. One of contact pads 125 and 127 is a positive contact pad, the other is a negative contact pad, while contact pad 126 is neither a negative or positive pad, but a thermal pad which is configured to facilitate transfer of heat from die 121 through heat conductive material 123 outside of LED package 120 via thermal pad 126. The positive and negative contact pads (125, 127) are electrically connected to die 121 via two wire bonds 124. The details of the sub-construction of LED package 120 are not critical to the present invention, and die 121, sub-mount 122 and heat conductive material 123 might be manufactured by a process in which they are integrally formed on a wafer; similarly, the details of how the positive and negative contact pads of LED package 120 are electrically isolated from one another are not critical to the present invention and a variety of different LED package structures might be suitable for use with the present invention, including LED package structures with five or more contact pads. What is important is that there are positive and negative electrically conductive pads to provide power to cause a die within the LED package to emit light and that any heat removal mechanism within the LED package can be thermally connected to an outer electrically conductive member of a heatsink assembly 70 via a thermal pad, as explained below.

A heatsink assembly 70 according to the present invention has three main parts—an outer electrically conductive member 71 that is thermally conductive and which is mechanically connected to an outer casing of a lighting apparatus (e.g., a barrel 11 of a flashlight 1), a core 72 of an electrically insulating material which is held within a cavity formed in outer electrically conductive member 71 and one or more inner electrically conductive members 73 which is/are positioned and electrically isolated from outer electrically conductive member 71 by core 72. It is especially preferred that outer electrically conductive member 71 maintains thermal and mechanical connection to barrel 11 by a mechanical contact (such as a press fit, nut and thread connection, or some other mechanical means).

LED package 120 is thermally and electrically connected to heatsink assembly 70 so that LED package 120 is turned on when power from an electrical circuit is applied to outer electrically conductive member 71 and inner electrically conductive member 73.

FIGS. 4A through 7D depict variations on the inventive design of the present invention. As shown, heatsink assembly 70 can be of different shapes depending upon the application. Heatsink assembly 70 can also support multiple LED packages 120 in a variety of configurations (see, e.g., FIGS. 7A-D); a circular array and a linear are only two of many possibilities. When multiple LED packages 120 are used with a single heatsink assembly 70, multiple inner electrically conductive members 73 can be used, one for each LED package 120, or multiple LED packages 120 can be bonded to a single inner electrically conductive member 73. Electronics with a suitable interconnect method can also be suspended in insulating core 72. For example, as illustrated in FIGS. 6A-D, PCB 77 with four traces 77T on each of its planar sides (see FIG. 6A which illustrates one side) is held by upper and lower portions 73A and 73B, each of which has four ears 77EARs for engaging four traces 77T, which provide multiple electrical paths for completing an electrical circuit to power up LED package 120. It is also possible in all cases to provide electrically insulating material that positions and electrically isolates two electrically conductive members that extend out of the end opposite from LED package 120 to provide electrical connection points. In these cases the cathode and anode LED package pads are bonded to corresponding isolated pads and the LED package thermal pad is bonded to electrically conductive member 71.

The improved heatsink assemblies illustrated in FIGS. 4A through 7D do not utilize a PC board for mounting a LED package 120; instead, LED package 120 is mounted directly to metal top surface 71T of outer electrically conductive member 71 and metal top surface 73T of inner electrically conductive member 73. This method produces much improved heat transfer and a cooler operating, higher lumens LED package 120, compared to PC board mounted LED designs.

The present invention provides a direct efficient path to conduct heat away from an LED package to ambient air outside of a flashlight or any other lighting device such as a headlamp, lantern or spotlight, as well as all types of area lighting that utilize high powered LEDs as a light source. Other heatsinking methods produce thermal paths that include a large number of thermal junctions, some of which have poor thermal conductivity or high thermal resistance. Examples of prior art heatsinking methods are illustrated in FIGS. 2A through 3D. Unique to the present invention is the ability to solder the heatsink component, which is outer electrically conductive member 71, directly to the electrical and thermal pads of LED package 120. No thermal grease or adhesives are required. In other designs heatsinking and electrical contact pads are on a PC board which results in more, less efficient, thermal junctions and longer, smaller cross section, thermal paths to ambient air. The use of thermal grease and adhesives in these less efficient designs helps heat transfer to some degree but not to the level of attaching the LED package directly to the heatsink assembly. The result of the much improved heat transfer possible with the invention is that the LED package operates much cooler and therefore much more efficiently. Higher lumens are possible with no increase in power over conventional systems. It is also possible to maintain lumens at the same level as other less efficient systems but consume far less power. This is especially important in battery powered lighting systems as on-time is extended without reducing lumens.

It is worth noting that the efficiency of the present invention can be increased or optimized, with the aid of the present disclosure, by increasing or maximizing the surface area exposure between the heatsink component of the heatsink assembly and the thermally and electrically conductive outer casing while also designing the heatsink component to have a sufficient mass to effectively and efficiently conduct heat between the heatsink assembly and the outer casing.

It is also worth noting that the outer casing, which is illustrated in the exemplary embodiments depicted in FIGS. 4-7D as a tube or barrel, need not be thermally and electrically conductive over its entire outer surface, although an outer casing which is thermally and electrically conductive over its entire outer surface may achieve better results.

Core 72 of the present invention is, in an especially preferred embodiment, molded with inner electrically conductive member 73 in place, to form a single assembly, which is inserted into a cavity 71C formed in outer electrically conductive member 71 so that passageway 72P is formed between core 72 and outer electrically conductive member 71 in cavity 72C which is then filled with epoxy 72E to securely hold core 72 within cavity 72C and precisely position top surface 73T in opening 71OP of top surface 71T so that top surface 73T of inner electrically conductive member 73 is accessible for soldering to a contact pad of LED package 120 to form electrical connection 75. Epoxy 72E may be comprised of an adhesive or material made from a class of synthetic thermosetting polymers containing epoxy groups which function as a glue or be made of any other material suitable for being flowed or injected into passageway 72P which will then harden and function to glue core 72 to outer electrically conductive member 71 within cavity 71C. It is especially desirable that outer electrically conductive member 71 include an additional mechanical means for holding core 72 within cavity 71C, one example of which is to include one or more keyways 71K that will form mechanical retention mechanisms once passageway 72P is filled with epoxy 72E.

Figure 12A:
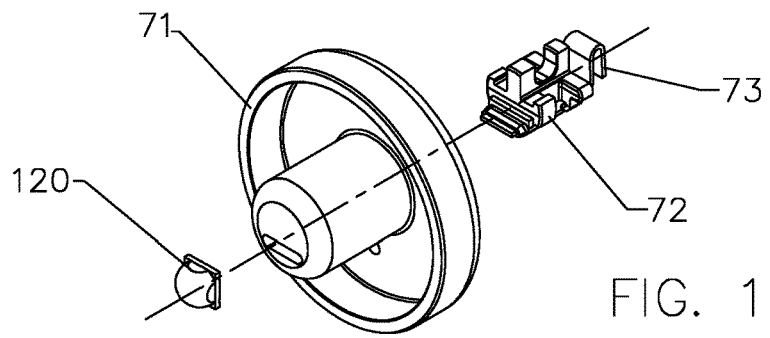
Figure 12B:
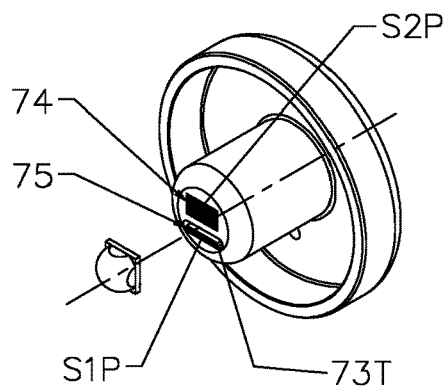
Figure 12C:
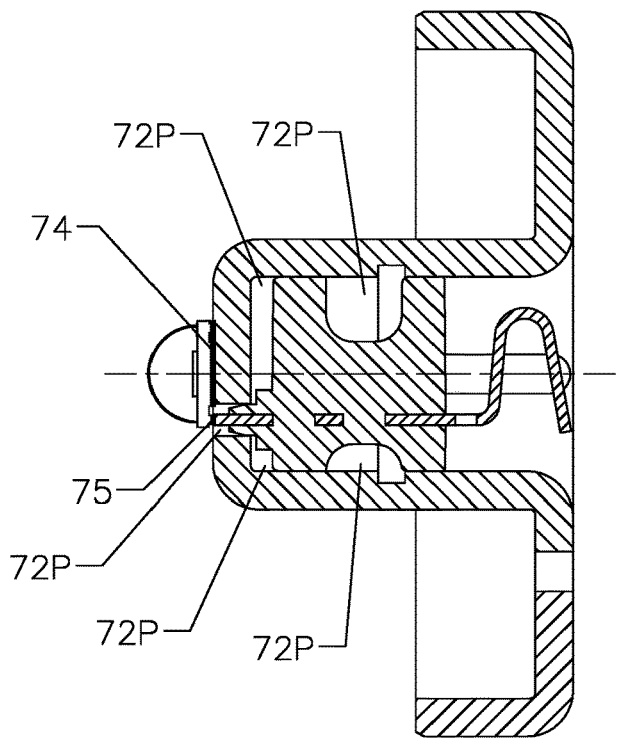
Figure 12D:
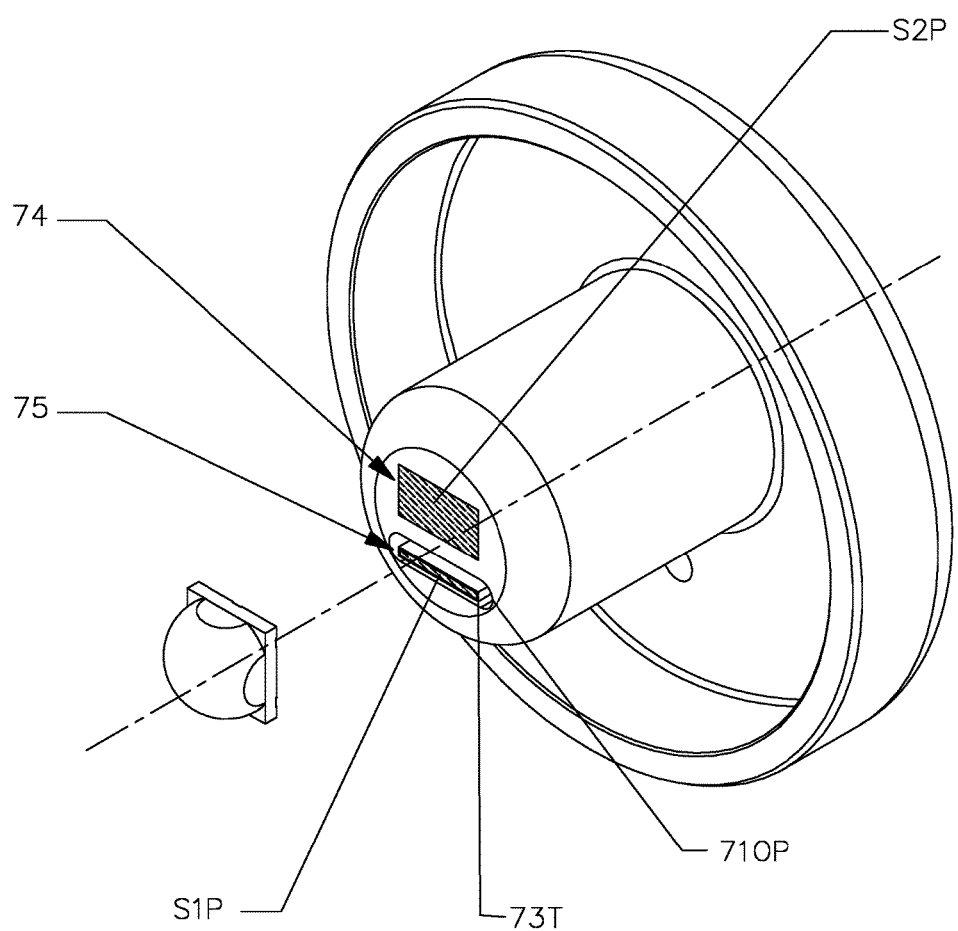
Figure 12G:
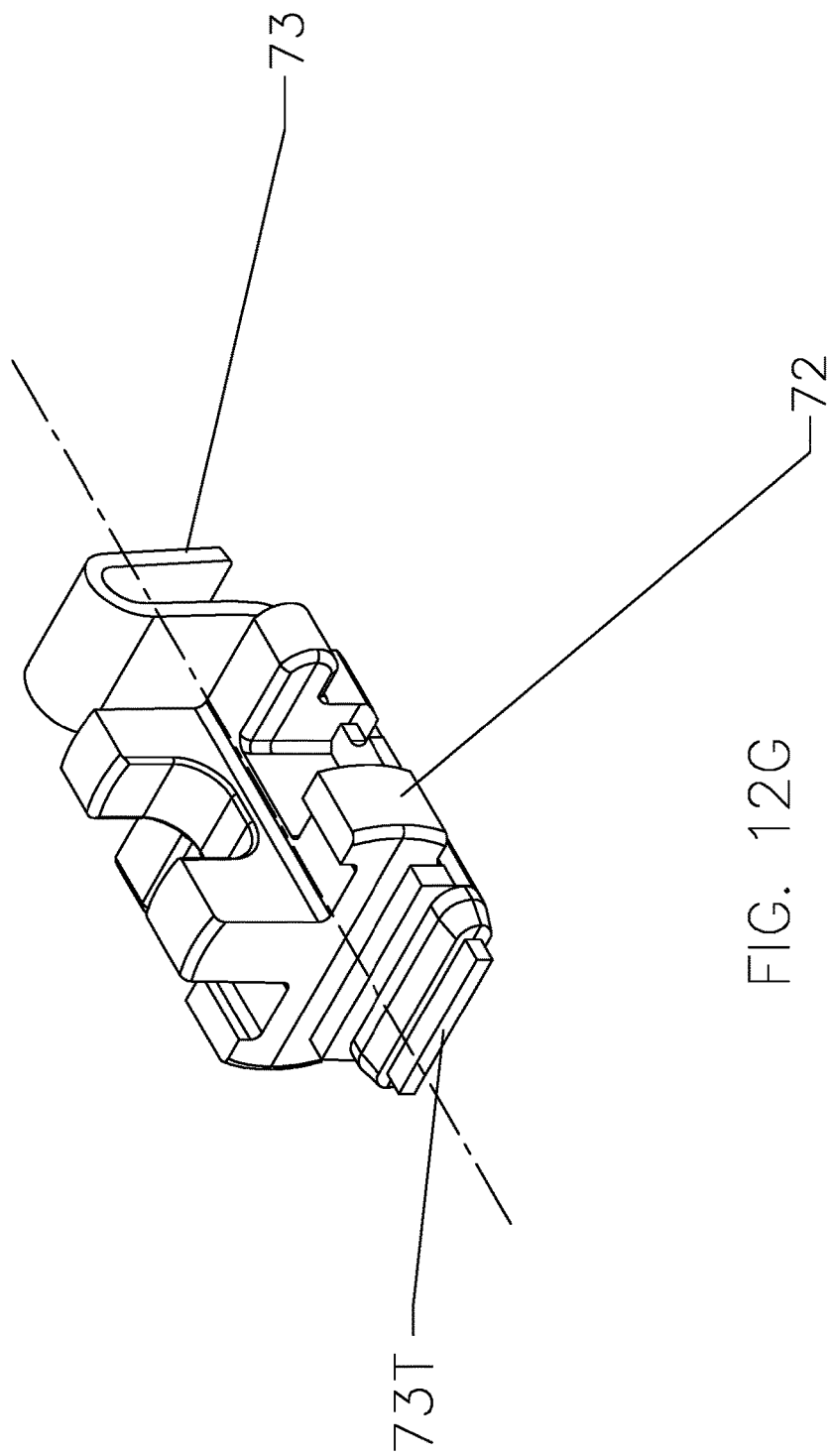
Figure 13A:
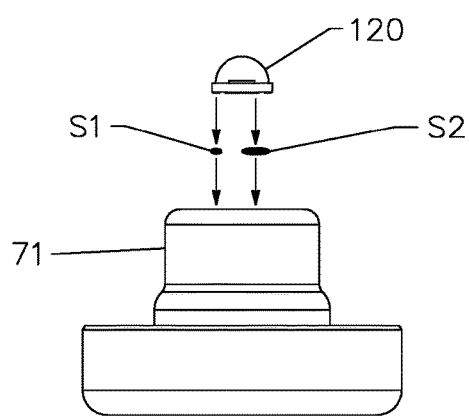
Figure 13B:
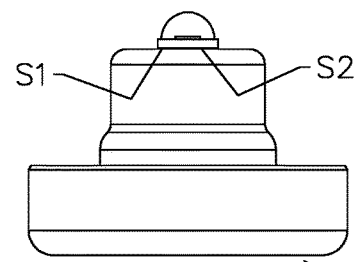

After core 72 is secured within cavity 71C, heatsink assembly 70 is created by soldering a thermal pad and an electrically conductive pad of LED package 120 to top surface 71T of heatsink component 71. Commercially available LEDs typically have three or more pads (see, e.g., FIG. 1A which illustrates three pads) which can all be used for soldering (solder S1 in FIG. 13A is for one pad whereas solder S2 in FIG. 13A is for two pads). FIG. 12B illustrates solder points S1P and S2P for solder S1 and S2.

Outer electrically conductive member 71 serves as the heatsink component of heatsink assembly 70 and its top surface 71T (see FIG. 4C) provides a mounting surface for LED package 120. The anode or cathode contact pad of LED package 120, as well as a dedicated thermal pad (e.g., 126 of FIG. 1A), are bonded to top surface 71T by soldering or some other thermally and electrically conductive method or material while the electrically opposite side of LED package 120 is bonded to top surface 73T of inner electrically conductive member 73. Heat generated by LED die 121 is conducted through sub-mount 122 to heat conductive material 123 to thermal pad 126 and one of pads 125, 127 where it is conducted through thermal junction 174 to outer electrically conductive member 71 and then through thermal junction 76 to barrel 11 to ambient air. LED package 120 runs much cooler and more efficiently in this system than is possible when LED package 120 is mounted on printed circuit boards (such as is shown in FIGS. 2A-3D) because of lower thermal resistance of the system. Thermal resistance is a heat transferring property of an overall system irrespective of the source of heat which is measured in the system's increase in temperature per unit of conducted heat energy, such as ° C./W.

Figure 13C:
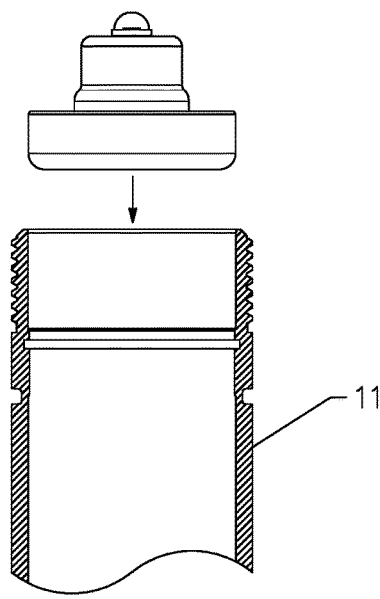
FIGS. 13C-D illustrate a press fit step of inserting a heatsink assembly into a tube or barrel.
Figure 13D:
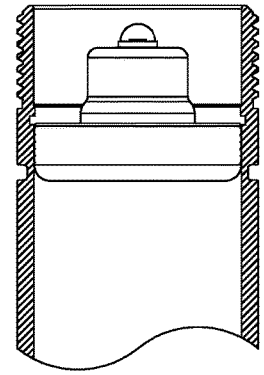
Figures 14A, 14B:
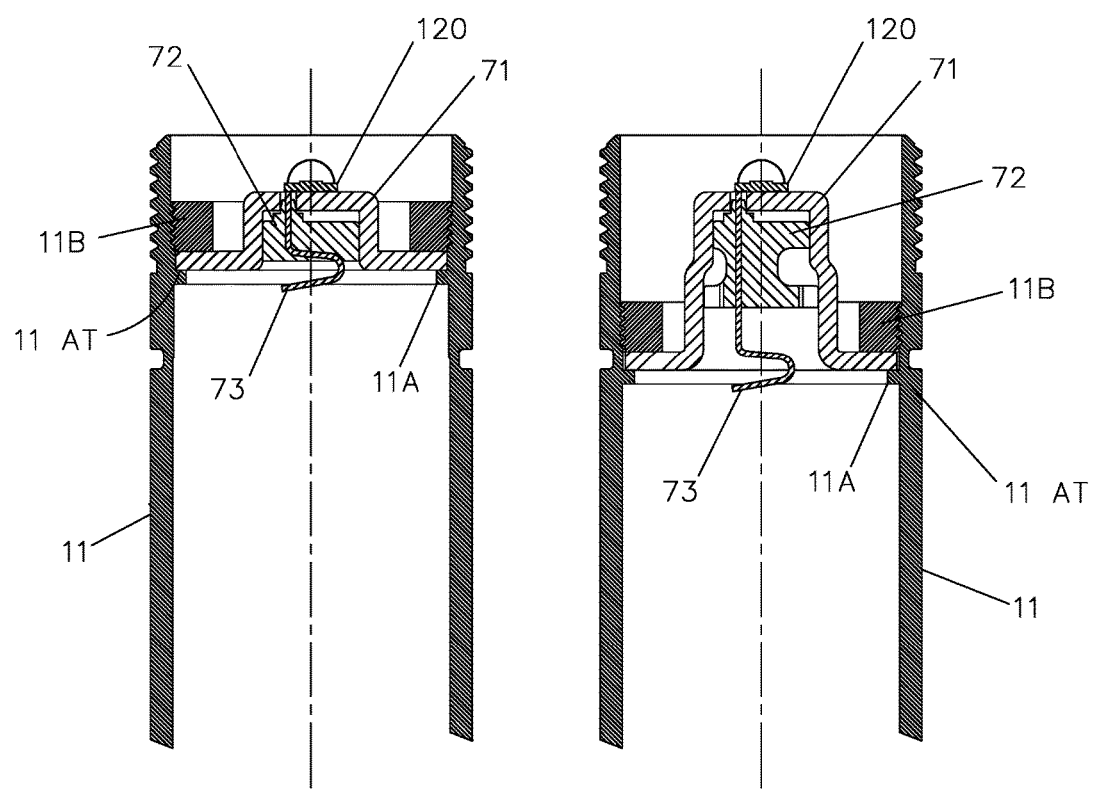
FIGS. 14A-B illustrate variations on FIGS. 13D in which the heatsink assembly is secured to a tube or barrel by use of mechanical retention means rather than a press fit.
Figure 15:
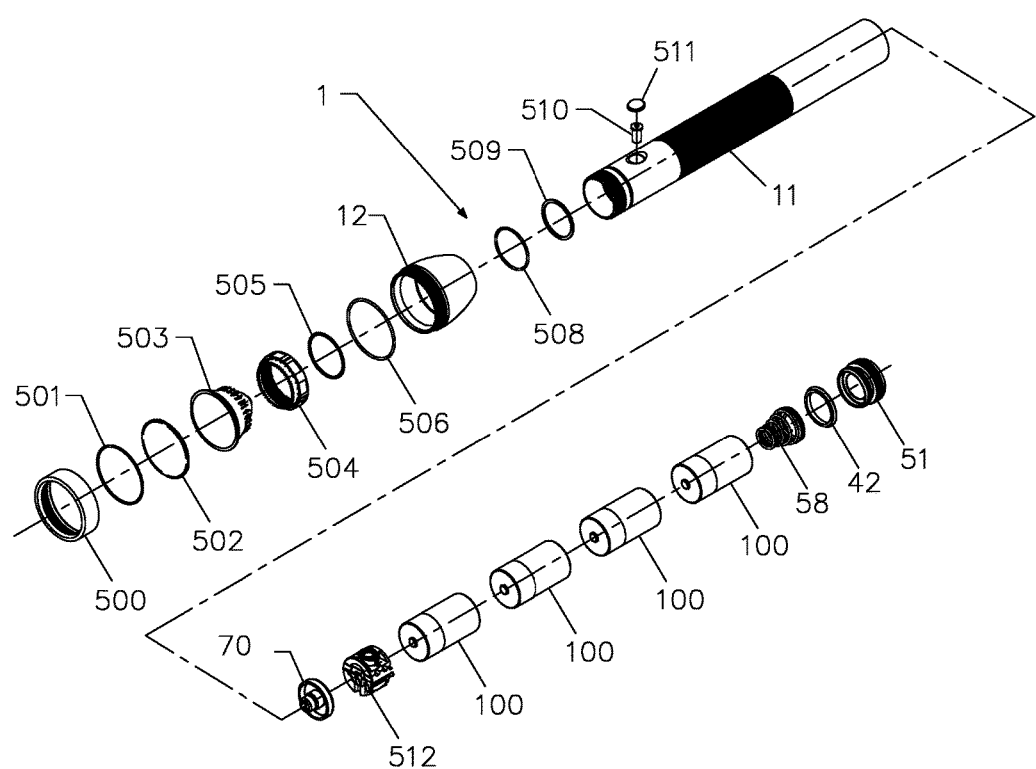
Figure 16:
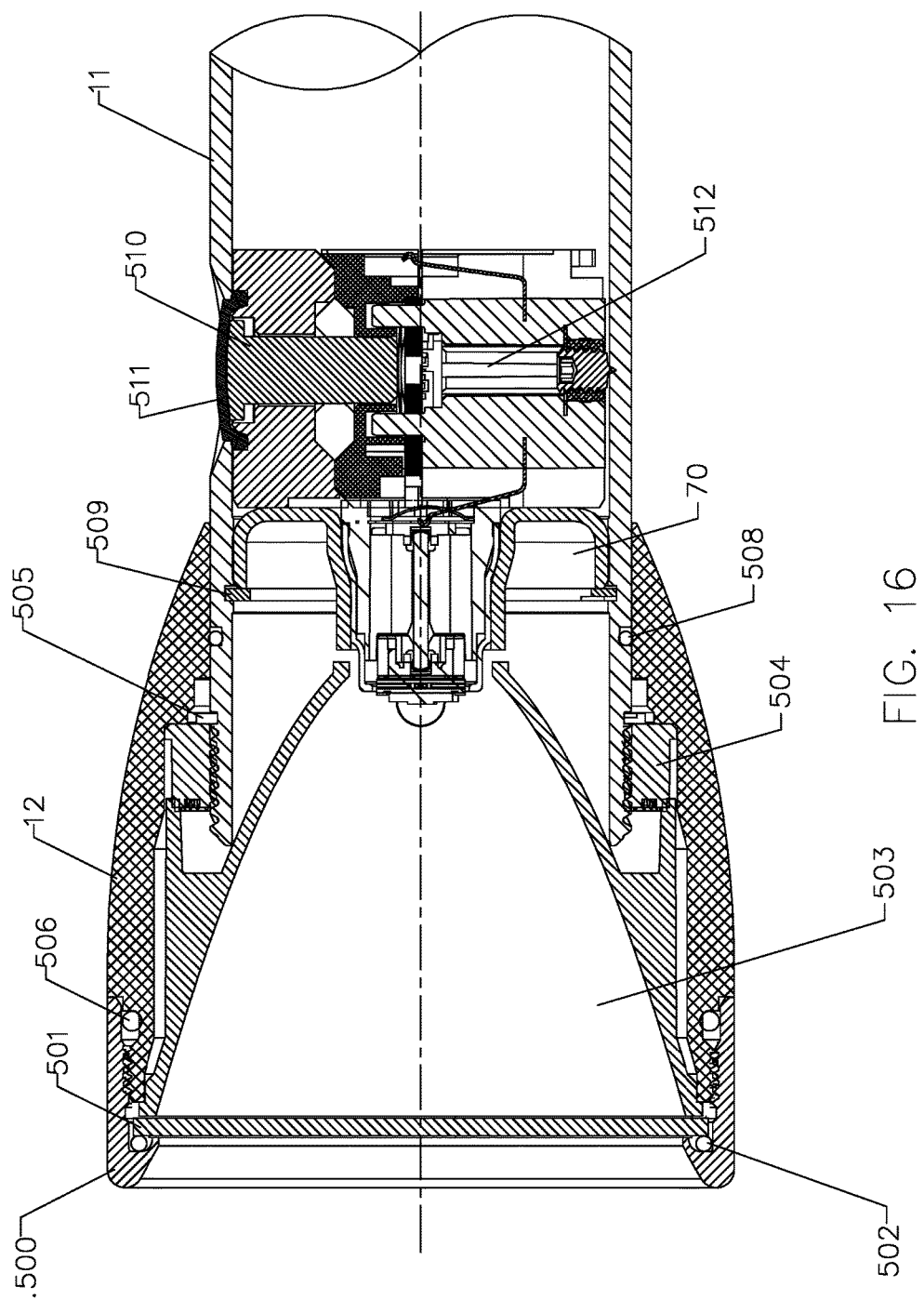
FIG. 16 is a cross sectional view of the head portion of the LED flashlight shown in FIG. 15 in an assembled state.

Once heatsink assembly 70 is created, it can be press fit into a tube or barrel 11 as illustrated in FIGS. 13C and 13D or it can be removably inserted into tube or barrel 11 and then be held in place by a removable holding mechanism, an example of which is nut 11B illustrated in FIGS. 14A and 14B. In the embodiments illustrated in FIGS. 14A and 14B, in an especially preferred embodiment, tube or barrel 11 and heatsink component 71 are made of aluminum, heatsink component 71 is coated with a metallic plating (e.g., nickel) that helps promote the soldering process, and a skin cut is made of the anodized aluminum where heatsink component 71 comes into contact with a top surface 11AT of shoulder 11A formed in tube or barrel 11 (so as to promote more efficient thermal heat transfer and for electrical condutivity). Also, it is especially desirable that heatsink assembly 70 be designed so that it can receive a reflector 503 (see FIG. 16) so that LED package 120 is positioned within reflector 503 facing outwardly from a head end of barrel 11.

Figure 4A:
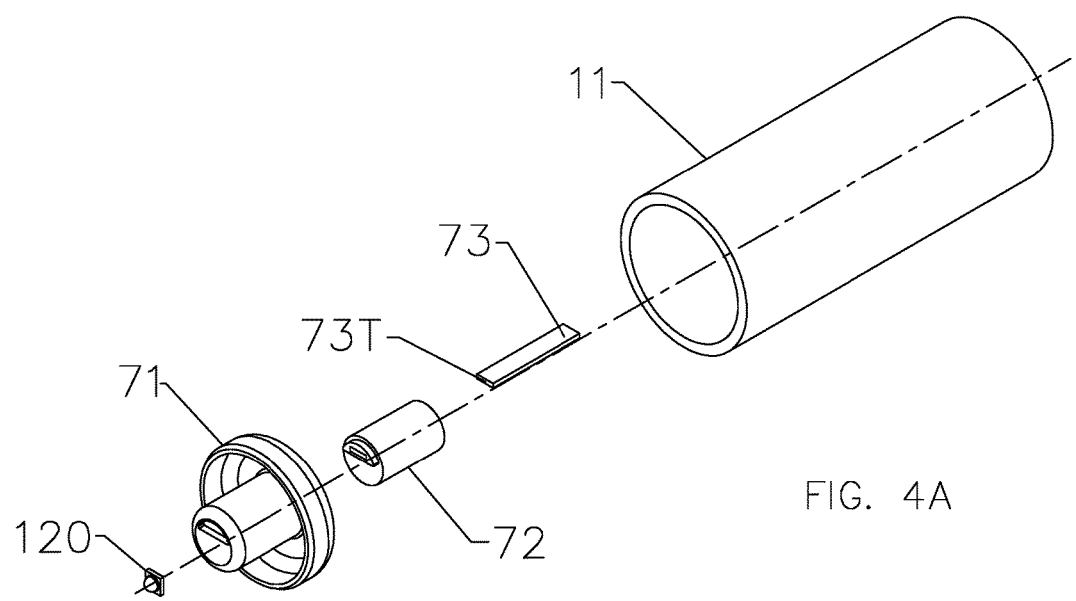
FIGS. 4A-D illustrate a heatsink assembly in accordance with one embodiment of the present invention installed in a metal tube or flashlight barrel.
Figure 4B:
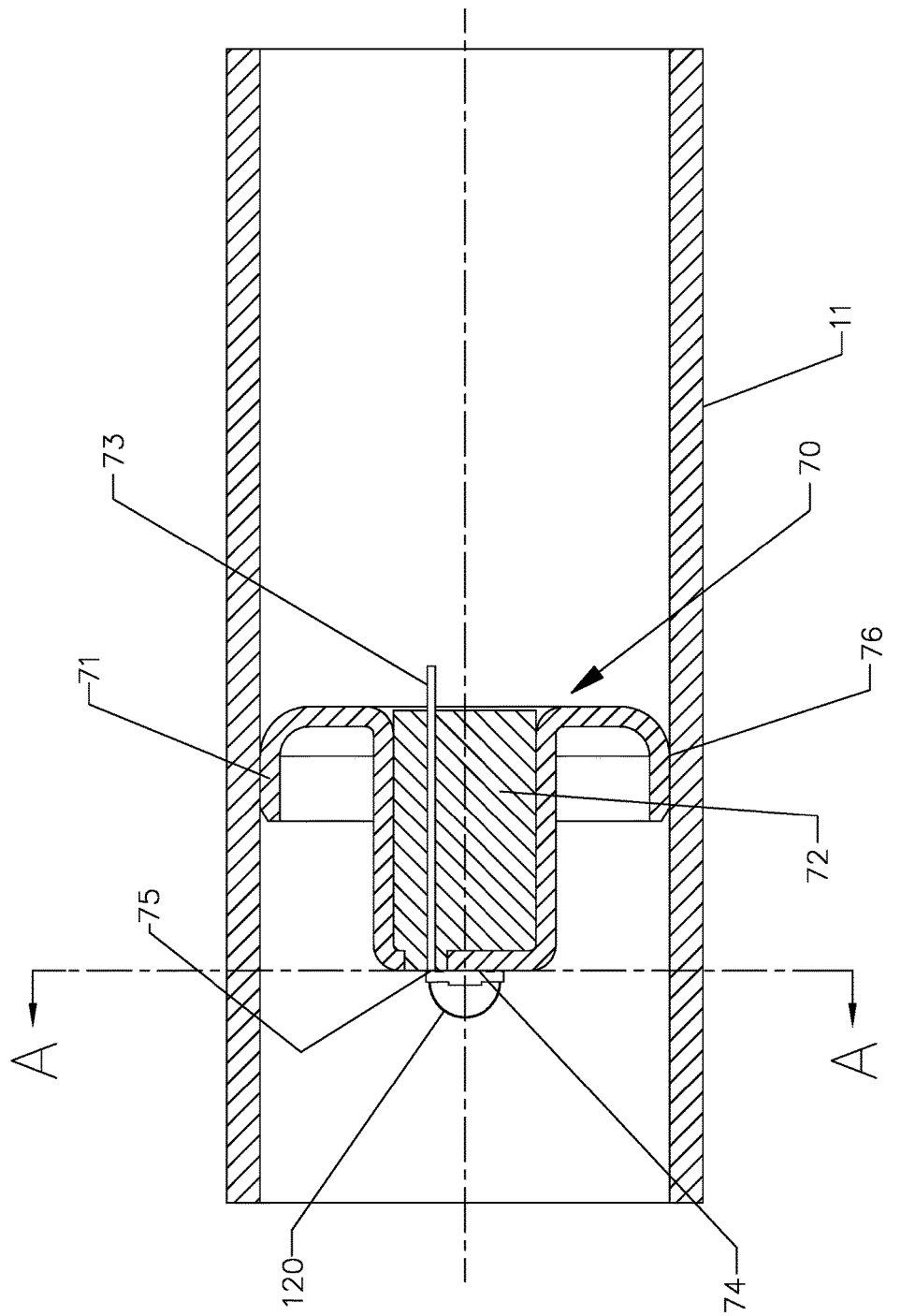
Figure 4C:
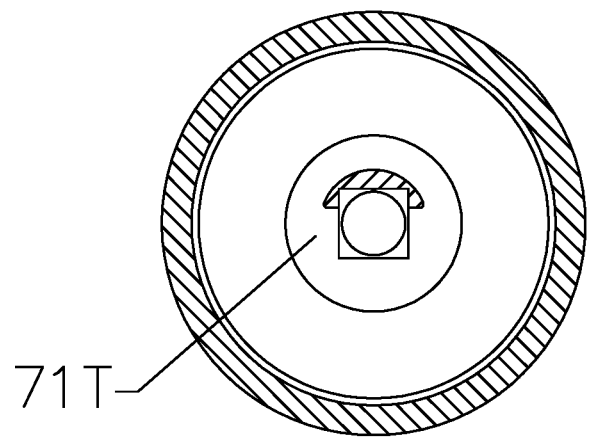
Figure 4D:
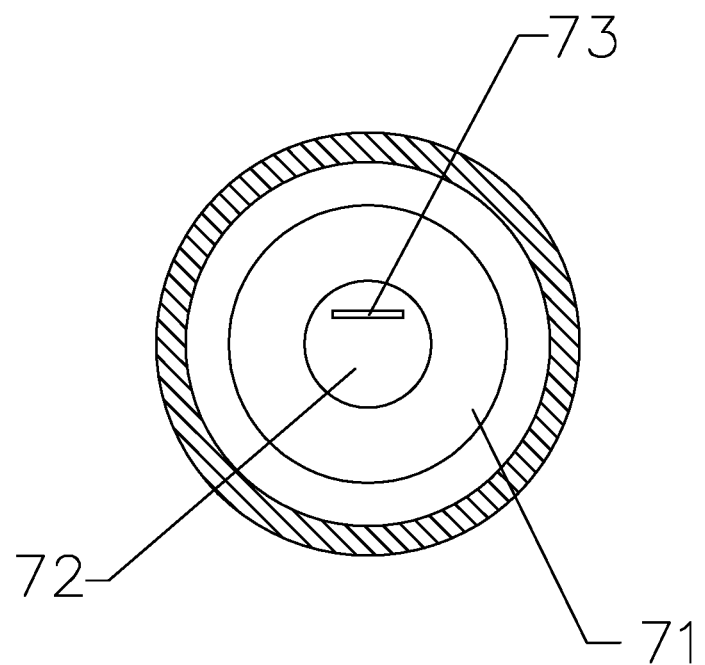
Figure 5B:
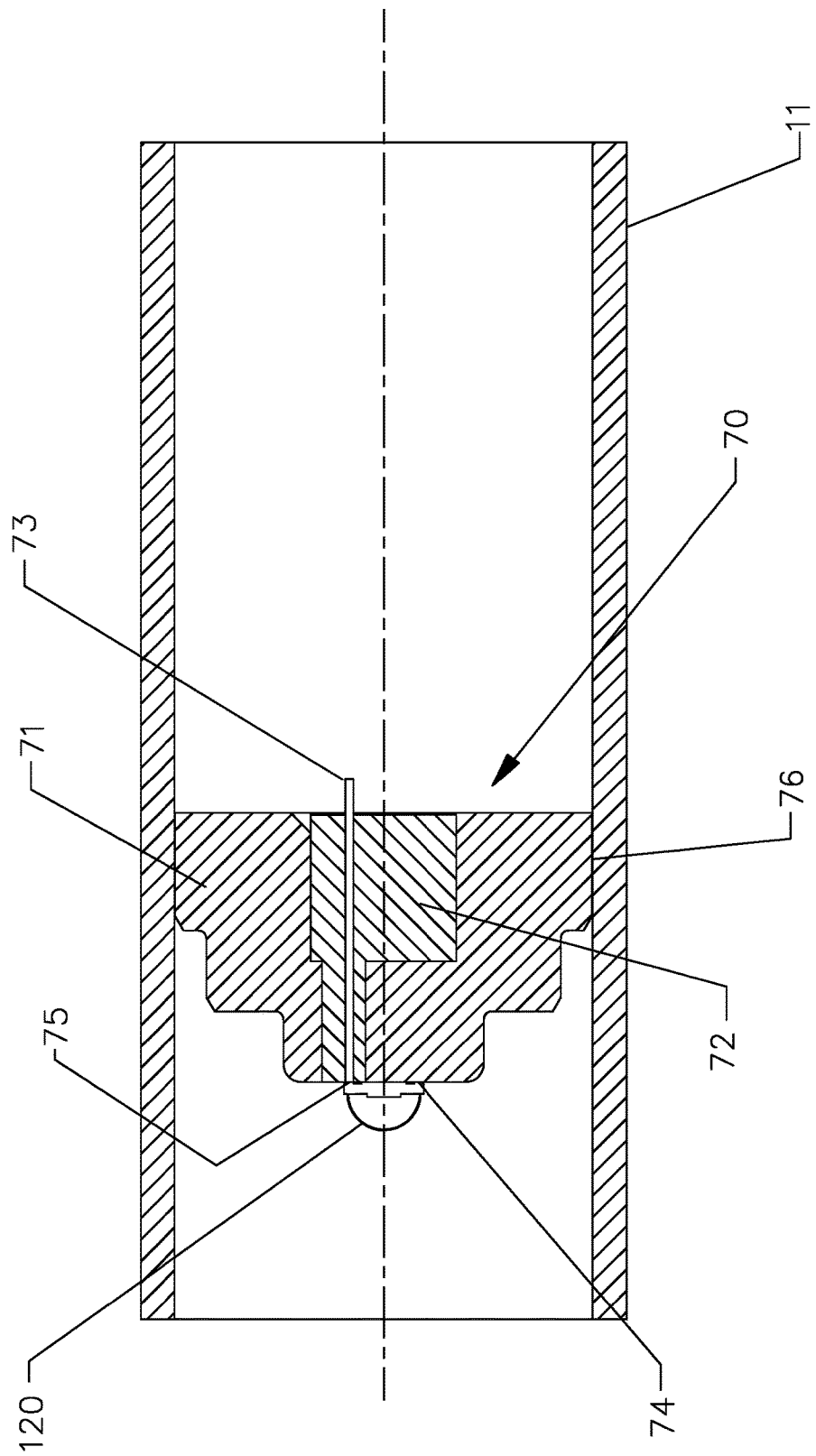
Figure 5C:
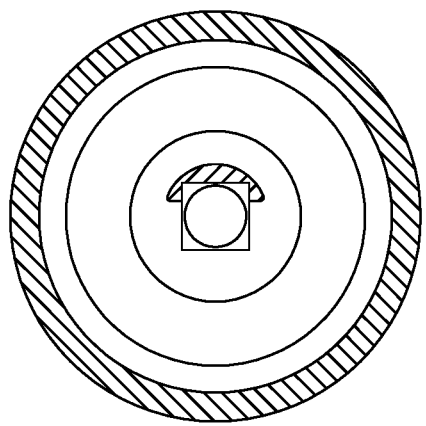
Figure 5D:
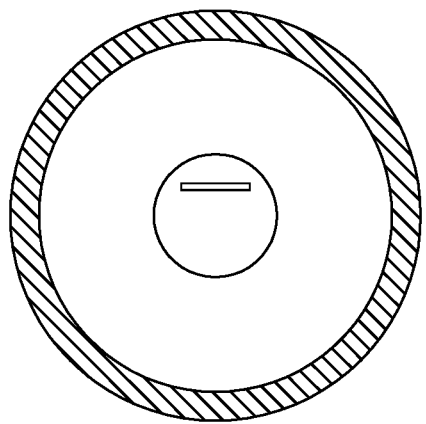
Figure 6C:
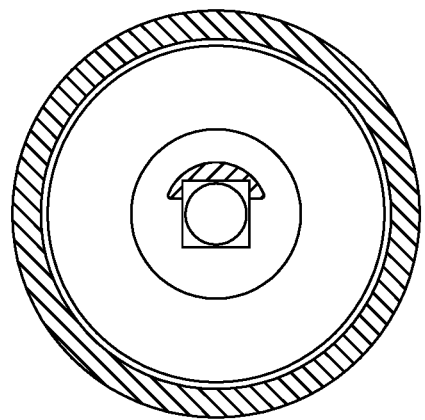
Figure 6D:
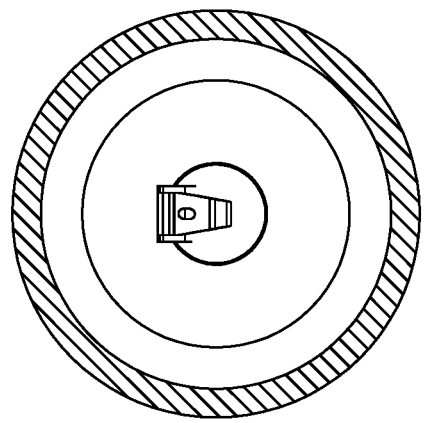
Figure 8:
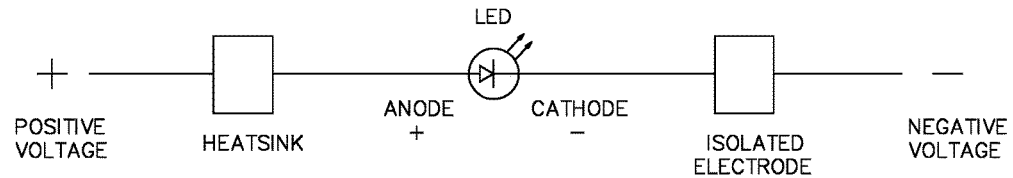
Figure 9:
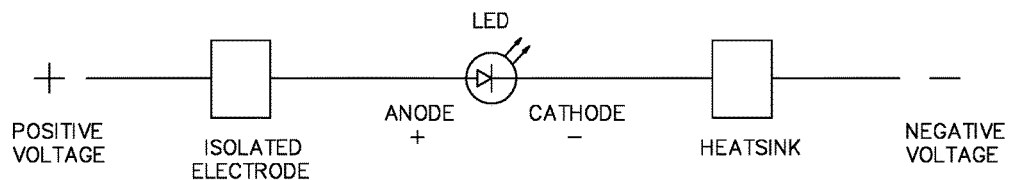
Figure 10:
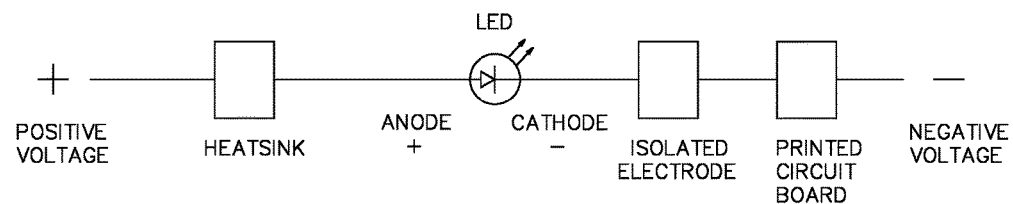
FIGS. 10 and 11 illustrate the same heatsink mounted LED positive and negative polarity heatsinks that incorporate a PCB with LED drive electronics.
Figure 11:
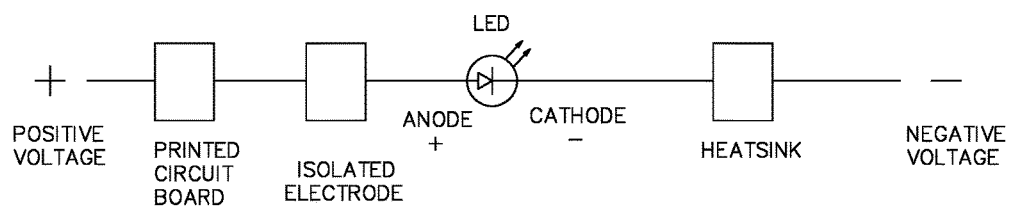

When heatsink assembly 70 is held by mechanical contact with barrel 11, a thermal path is created between the thermal pad and one contact pad of LED package 120 which is bonded to electrically conductive member 71 and barrel 11 which has a first thermal junction 74 between said thermal pad and one contact pad of LED package 120 and outer electrically conductive member 71 and a second thermal junction 76 between outer electrically conductive member 71 and barrel 11 (see FIG. 4B). Minimizing the number of thermal junctions between LED package 120 and barrel 11 helps to minimize thermal resistance.

To demonstrate the lower thermal resistance obtainable by use of the heatsink technology of the present invention, tests were performed between different heat sink systems for use in a tube sized to accommodate a c-cell size battery. For each device under test (DUT), an LED package from the same family of LEDs was mounted on a heatsink system as noted below which was then pressed into a piece of aluminum of the same size and diameter to create the DUT, with the DUTs assembled as follows.

The UNI Module DUT used a heatsink system that corresponds to what is depicted in FIGS. 2A-E in which the heatsink module was pressed into aluminum which was then pressed into the tube of aluminum.

The Starboard DUT used a heatsink system that corresponds to what is depicted in FIGS. 3A-D in which the starboard was screwed onto a piece of aluminum with thermal grease located between the starboard and the piece of aluminum, and then this assembly was pressed into the tube of aluminum.

The 0.070" AL Molded DUT used a heatsink system that corresponds to what is depicted in FIGS. 4A-D in which outer electrically conductive member 71 is made out of aluminum with a thickness of 0.070 inches while the 0.070" Cu Molded DUT is the same heatsink system made out of copper instead of aluminum.

The Solid AL Molded DUT used a heatsink system that corresponds to what is depicted in FIGS. 5A-D while the Solid Cu DUT is the same heatsink system made out of copper instead of aluminum.

The DUTs were tested using the following testing methodology to obtain the test results set forth in Table 1:

Measure LED solder point temperature $\{T_{sp}\}$. A precision thermocouple (Type J or Type K) is placed directly adjacent to LED package on the surface of the heatsink.

DUT is powered from a digitally controlled power source at desired current level $\{I_{LED}\}$ and is recorded for later calculations DUT is powered on long enough for solder point temperature to stabilize (usually 30 to 45 minutes). Temperature is measured and logged using precision data acquisition instrument. Once peak temperature is observed, it is recorded as $\{T_{sp}\}$ Measure LED Forward Voltage $\{V_f\}$ at desired current level $\{I_{LED}\}$ when peak $\{T_{sp}\}$ is observed. The LED Voltage $\{V_f\}$ is measured using a precision volt meter connected directly to the LED solder pads Total LED Power Dissipation $\{P_d\}$ is calculated using equation 1. LED current $\{I_{LED}\}$ multiplied by measured LED Forward Voltage $\{V_f\}$.

Calculate thermal resistance $\{\theta_{Rth}\}$ using equation 2. This is the total thermal resistance of the heat sink and flashlight barrel, from LED solder point $\{T_{sp}\}$ to ambient air $\{T_{amb}\}$ Obtain manufacturer's thermal resistance $\{\theta_{RthLED}\}$ specification for the LED family being used. In this case, the Cree XM-L2 is 2.5° C./W.

Calculate LED junction temperature $\{T_j\}$ using equation 3. This is the temperature of LED die, also called LED junction.

Equations:

$$P_d = I_{LED} * V_f \qquad 1.$$

$$\theta_{Rth} = (T_{sp} - T_{amb})/P_d \qquad 2.$$

$$T_j = (P_d * \theta_{RthLED}) + T_{sp} \qquad 3.$$

Definitions of Variables and Constants:

$\theta_{Rth}$=Calculated Thermal resistance of heat sink (overall thermal resistance, from $T_{sp}$ to ambient air $T_{amb}$) [° C./W]

$T_{sp}$=Solder point temperature (measured directly adjacent to LED substrate) [° C.] using thermocouple $T_{amb}$=Ambient air temperature [° C.]

$P_d$=Total calculated dissipated power [W]

$I_{LED}$=LED drive current [A]

$V_f$=LED forward voltage [V]

$T_j$=Calculated LED Junction temperature [° C.]

$\theta_{RthLED}$=Manufacturer specified thermal resistance of LED family [° C./W]XM-L2 LED: 2.5° C./W

TABLE 1

| Device Under Test (DUT) | $V_f$ [V] | $P_d$ [W] | $T_{sp}$ [° C.] | $\Theta_{Rth}$ [° C./W] | $T_j$ [° C.] |
|---|---|---|---|---|---|
| UNI Module | 3.16 | 9.48 | 164 | 14.66 | 187.7 |
| Starboard | 3.27 | 9.81 | 95 | 7.14 | 119.53 |
| Solid flat Al | 3.28 | 9.84 | 92 | 6.81 | 116.6 |
| .070" Al Molded | 3.29 | 9.87 | 87 | 6.28 | 111.68 |
| Solid Al | 3.29 | 9.87 | 86 | 6.18 | 110.68 |
| Solid Cu | 3.29 | 9.87 | 83 | 5.88 | 107.68 |
| .070" Cu Molded | 3.3 | 9.9 | 80 | 5.56 | 104.75 |

| Constants | |
|---|---|
| $T_{amb}$ = | 25° C. |
| $I_{LED}$ = | 3 A |
| $\Theta_{RthLED}$ = | 2.5° C./W |

In calculating the results set forth in Table 1, it was assumed that 100% of total power is dissipated as heat. This is the absolute worst case scenario because, in a real world application, only about 60-70% of the total power is dissipated as heat, while the remaining 30-40% is converted to photon energy (light), but it's nearly impossible to know the precise efficacy (ability to convert electrical power to photon energy) of each LED, so 100% power dissipation was used for the worst case scenario.

It should also be noted that tests were made on a heatsink system that corresponds to what is depicted in FIGS. 4A-D with a smaller thickness of aluminum of .050 inches, but the results of that test, while superior to the UNI Module DUT, were not superior to that of the Starboard DUT, thus emphasizing the need for ensuring that outer electrically conductive member 71 is sufficiently thick so as to efficiently conduct heat away from the LED package.

While the invention has been described herein with reference to certain preferred embodiments, those embodiments have been presented by way of example only, and not to limit the scope of the invention. Additional embodiments will be obvious to those skilled in the art having the benefit of this detailed description.

Accordingly, still further changes and modifications in the actual concepts descried herein can readily be made without departing from the spirit and scope of the disclosed inventions as defined by the following claims.

What is claimed is:

1. A lighting apparatus, comprising:
an outer casing;
a light emitting diode ("LED") package contained within the outer casing, said LED package comprising:
   a substrate;
   an LED die held by the substrate, said LED die configured to emit light outwardly from a front surface of the LED package;
   a first electrically conductive pad;
   a second electrically conductive pad; and
   a thermal pad configured for removing heat from the LED die to outside of the LED package;
wherein the first and second electrically conductive pads are configured to provide power to cause the LED die to emit light; and
a heatsink assembly held within the outer casing, said heatsink assembly comprising:
   an outer electrically conductive member that is thermally conductive and which is thermally connected to the outer casing;
   a core of an electrically insulating material which is held within a cavity formed in the outer electrically conductive member; and
   an inner electrically conductive member which is positioned and electrically isolated from the outer electrically conductive member by the core;
wherein the first electrically conductive pad and the thermal pad are thermally and electrically bonded to a first top surface of the outer electrically conductive member without use of a printed circuit board and the second electrically conductive pad is electrically bonded to a second top surface of the inner electrically conductive member.

2. The lighting apparatus of claim 1, wherein the first electrically conductive pad and the thermal pad are soldered to the first top surface and the second electrically conductive pad member is soldered to the second top surface.

3. The lighting apparatus of claim 1, wherein the core and the inner electrically conductive member are comprised of a single molded assembly.

4. The lighting apparatus of claim 1, wherein the core is configured to form a passageway between the core and the outer electrically conductive member when the core is inserted into the cavity.

5. The lighting apparatus of claim 4, further comprising an epoxy held within the passageway.

6. The lighting apparatus of claim 5, further comprising a mechanical means for holding the core within the cavity.

7. The lighting apparatus of claim 5, further comprising a printed circuit board ("PCB") held within the core in a vertical orientation with respect to the first top surface.

8. The lighting apparatus of claim 1, wherein the lighting apparatus is comprised of a flashlight and the outer casing is comprised of a flashlight barrel.

* * * * *